(12) United States Patent
Tei

(10) Patent No.: US 7,205,801 B2
(45) Date of Patent: Apr. 17, 2007

(54) POWER DOWN CIRCUIT CAPABLE OF A WIDE RAGE CONTROL SIGNAL REGARDLESS OF THE POWER SUPPLY VOLTAGE FLUCTION

(75) Inventor: Koryo Tei, Tokyo (JP)

(73) Assignee: Nippon Precision Circuits Inc., Tokyo (JP)

( * ) Notice: Subject to any disclaimer, the term of this patent is extended or adjusted under 35 U.S.C. 154(b) by 39 days.

(21) Appl. No.: 11/242,500

(22) Filed: Oct. 3, 2005

(65) Prior Publication Data

US 2006/0220715 A1    Oct. 5, 2006

(30) Foreign Application Priority Data

Oct. 29, 2004    (JP)    ............................. 2004-316551

(51) Int. Cl.
*H03L 7/00* (2006.01)
(52) U.S. Cl. .................. 327/143; 327/198; 327/544
(58) Field of Classification Search ................ 327/143, 327/198, 544
See application file for complete search history.

(56) References Cited

U.S. PATENT DOCUMENTS 6,407,598 B1 * 6/2002 Ogane ..................... 327/143

FOREIGN PATENT DOCUMENTS

JP    5-160704    6/1993
JP    6-177657  *  6/1994    .................. 330/65

* cited by examiner

*Primary Examiner*—Kenneth B Wells
(74) *Attorney, Agent, or Firm*—Jordan and Hamburg LLP

(57) ABSTRACT

The present invention is to provide a power down circuit, which can configure a wide range of the voltage of the control signal regardless of the fluctuation of the power supply voltage. In the power down circuit 1, the drain of the first N channel MOS transistor M1, into which the control signal PD is input, is connected to the power supply VDD via the resistor R, and at the same time, connected to the gate of the second N channel MOS transistor M2, the source of the second N channel MOS transistor M2 being connected to the gate of the N channel MOS transistor M4, to which the bias voltage VB is supplied, the drain of the N channel MOS transistor M4 being connected to the power supply VDD via the drain of the P channel MOS transistor M3, when the first N channel MOS transistor M1 is turned on/off by the control signal PD, the second N channel MOS transistor M2 is turned off/on, and the bias circuit 2 is operated under a normal condition when it is off, and comes into a power down state when it is on.

3 Claims, 2 Drawing Sheets

POWER DOWN CIRCUIT CAPABLE OF A WIDE RAGE CONTROL SIGNAL REGARDLESS OF THE POWER SUPPLY VOLTAGE FLUCTION

BACKGROUND OF THE INVENTION

1. Field of the Invention

The present invention relates to a power down circuit for reducing power consumption of an electronic circuit apparatus.

2. Related Background Art

A conventional power down circuit is largely classified into two methods: a first method is to suppress power consumption by controlling a bias voltage of a particular block in an electronic circuit, and a second one is that an entire circuit is connected to a power source through a switch, which is formed by a MOS-type field effect transistor (hereinafter, called as a MOS transistor), and the power consumption is suppressed by stopping the supply of the power source to an entire circuit by turning off the switch for a certain time period (Refer to Japanese Patent Laid Open No. 1993-160704).

FIG. 1 shows an example of the bias circuit controlled by the conventional power down circuit according to the first method. In the configuration of FIG. 1, the MOS transistor M21 is a transistor having a low threshold voltage and when a power down control signal (hereinafter, called as a control signal) PD becomes high-level, a MOS transistor M31 and a MOS transistor M41, into which the control signal PD is input with an inversed polarity, are being OFF state, said bias circuit being looked upon as being under a normal operation and controls the bias current of the back-stage circuit in accordance with the bias voltage VB. On the other hand, when the control signal PD becomes low-level, both MOS transistors M31, M41 turn on, and gate-source voltages (hereinafter, called as VGS) of MOS transistors M11, M21 become zero volt, thereby, the consumption current of the circuit is reduced to come into a power down state.

Next, as shown in FIG. 2, in place of the MOS transistor M41 in the circuit of FIG. 1, such a configuration is known as a MOS transistor M51, with an inversion signal of the control signal PD being entered into the gate, is connected between the drain of the MOS transistor M21 and the gate of the MOS transistor M11. According to this configuration, when the control signal PD is high-level, the MOS transistor M31 is being OFF state, the MOS transistor M51 turns on, the MOS transistor M21 becomes on-state, and the bias circuit usually becomes a normal operating state. On the other hand, when the control signal PD becomes low-level, the MOS transistor M31 turns on, the MOS transistor M51 is being OFF state, the MOS transistor M21 is being OFF state, and the bias circuit becomes power down state. Thus, with the MOS transistor M51 standing in between, without deteriorating the characteristics of the circuit including the MOS transistor M21 having a low voltage threshold, a low noise power down circuit can be realized.

SUMMARY OF THE INVENTION

With regard to the conventional circuit shown by the above-mentioned FIG. 3 and FIG. 4, while the bias circuit is operated when the control signal PD becomes high-level, if the power source voltage VDD fluctuates, the voltage Vpd of the control signal PD also have to be changed. It is because the condition that the control signal PD becomes high-level is Vpd>VDD−|Vth31|. Here, Vth31 is the threshold voltage of the transistor M31. Thus, when the power source voltage VDD becomes high-level, the power down control signal PD also have to be made high-level, therefore, there is a problem that the control signal PD cannot be applied to a wider range of voltage. The purpose of the present invention is to provide a power down circuit, which solved the above-mentioned problem not to be affected by the fluctuation of the power source voltage.

In order to solve the problem, since by configuring that between a first N channel MOS transistor M1, which is made to perform ON/OFF operation based on the control signal, and power source VDD, a resistor R is directly connected, the drain of said first N channel MOS transistor M1 being connected to the gate of a second N channel MOS transistor M2, in response to the ON/OFF operation of said first N channel MOS transistor M1, said second N channel MOS transistor M2 being made to perform OFF/ON operation in the opposed way, and through the OFF/ON operation of the second N channel MOS transistor M2, the current of the control object circuit being controlled, it is enough to consider the threshold voltage of the first N channel MOS transistor M1 regarding the electrical potential of the control circuit, the power down circuit according to the present invention can be widely configured without the consideration about the fluctuation of the source voltage.

More specifically, a power down circuit according to the invention comprising a first N channel MOS transistor M1 having a drain, a source connected to the ground terminal and a gate receiving a power down control signal, a load element connected between the power source terminal and the drain of the first N channel MOS transistor M1, and a second N channel MOS transistor M2 having a first terminal for receiving a signal based on the power down control signal, a gate connected to the drain of the first N MOS transistor M1 and a second terminal connected to the control terminal of the subsequent circuit, wherein a resistance value of the load element and an operation resistance value of the first N channel MOS transistor M1 are set up so that the second N channel MOS transistor M2 is being OFF state during the first N channel MOS transistor M1 turns on, and the second N channel MOS transistor M2 turns on during the first N channel MOS transistor M1 is being OFF state.

According to the present invention, when the first N channel MOS transistor M1 becomes on, that is, the voltage Vpd of the control signal PD becomes higher than that of the threshold of the first N channel MOS transistor M1, the second N channel MOS transistor M2 can become off to enable the control object circuit to be under a normal operation, when the first N channel MOS transistor M1 becomes off, through that the second N channel MOS transistor M2 becomes on to enable the control object circuit to be power down, without being affected by the fluctuation of the power supply voltage VDD, the normal operation of the control object circuit and a reduction of the power consumption always and securely becomes possible.

DESCRIPTION OF THE PREFERRED EMBODIMENTS

Figure 1:
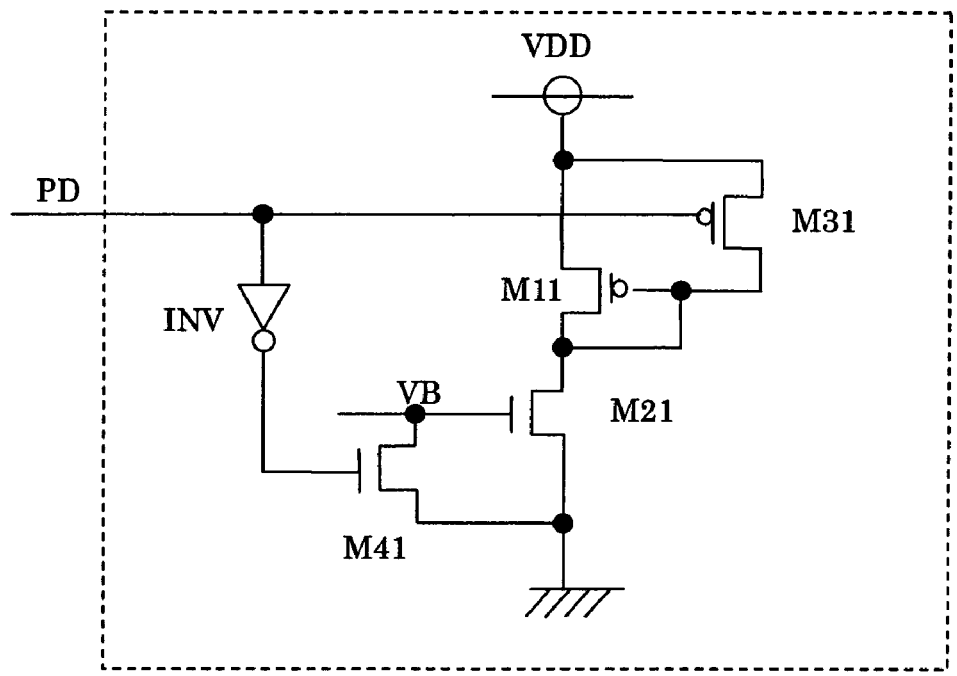
FIG. 1 shows a first example of the conventional power down circuit.
Figure 2:
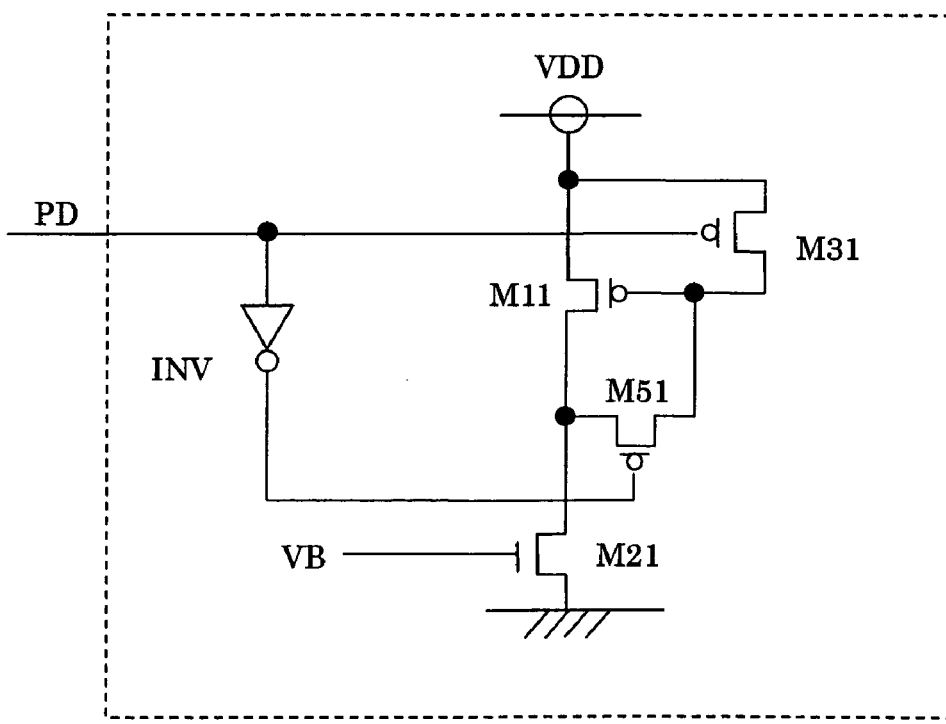
FIG. 2 shows a second example of the conventional power down circuit.
Figure 3:
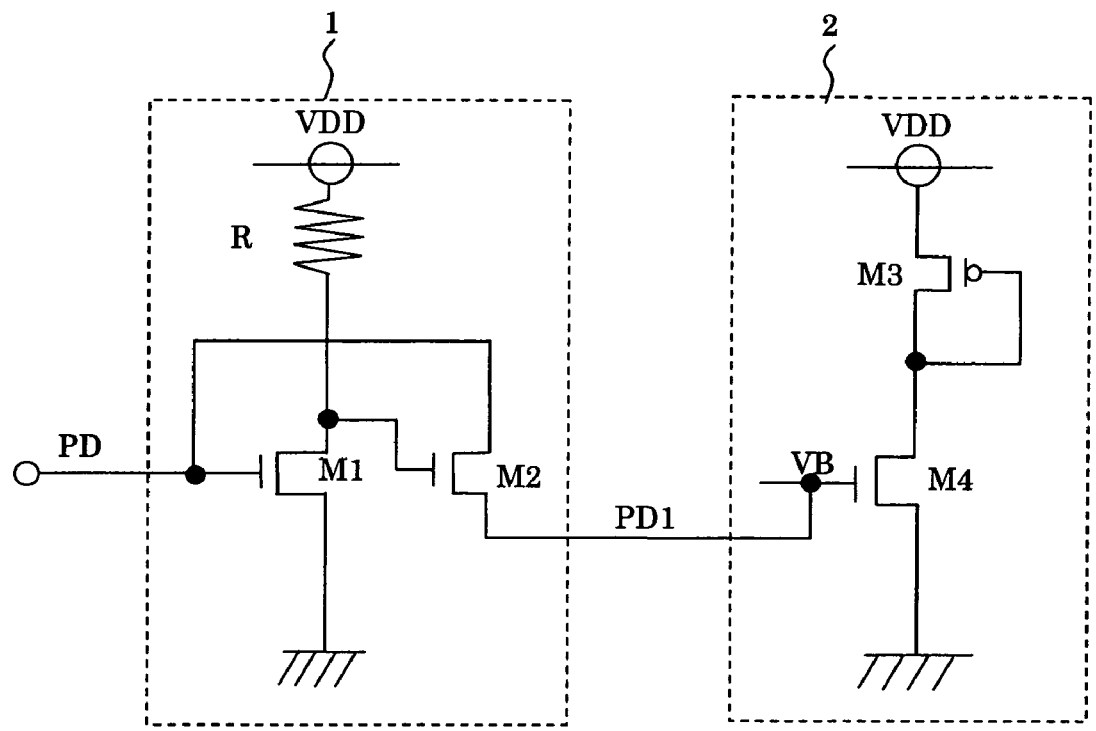
FIG. 3 shows the power down circuit according to the first embodiment of the invention.

In the following, explanations will be given to preferred embodiments when the invention is applied to the bias circuit, while referring to attached drawings. FIG. 3 shows a power down circuit according to a first embodiment of the invention. While the drain of the first N channel MOS transistor M1, in which the control signal PD is input into the gate, is provided with the power supply voltage VDD via a resistor R, the source is grounded. A node between the drain of the first N channel MOS transistor M1 and the resistor R, the gate of the second N channel MOS transistor M2 is connected, and the drain of the second N channel MOS transistor M2 is connected to the gate of the first N channel MOS transistor M1.

When the voltage Vpd of the control signal PD becomes high-level to exceed the threshold voltage of the first N channel MOS transistor M1, the first N channel MOS transistor M1 turns on, then, the second N channel MOS transistor M2 configures the resistance of the resistor R and the on-resistance of the first N channel MOS transistor M1, so that the M2 becomes OFF state after the gate voltage becomes lower than the threshold voltage. Further, when the voltage Vpd of the control signal PD becomes low-level and the first N channel MOS transistor M1 becomes OFF state, the second N channel MOS transistor M2 is configured in such a way that the electrical potential of the gate becomes high-level to be ON.

While the source of the second N channel MOS transistor M2 is connected to the gate of the N channel MOS transistor M4, to which the bias voltage VB of the bias circuit 2 as a control object circuit is supplied, the drain of the N channel MOS transistor M4 is connected to the gate and source of the P channel MOS transistor M3, and the source of the above-mentioned N channel MOS transistor M4 is grounded, the power source voltage VDD is supplied to the drain of the above-mentioned P channel MOS transistor M3.

Accordingly, when the control signal PD becomes high-level, the first N channel MOS transistor M1 turns on and the second N channel MOS transistor M2 is being OFF state. Since the second N channel MOS transistor M2 is being OFF state, the control signal PD is not supplied to the gate of the N channel MOS transistor M4. Now therefore, the N channel MOS transistor M4 turns on, to which the bias voltage VB is supplied, and the bias circuit 2 becomes a normal operating state. On the other hand, when the control signal PD becomes low-level, the first N channel MOS transistor M1 is being OFF state, and the second N channel MOS transistor M2 turns on, since the low-level control signal PD1 via the second N channel MOS transistor M2 is transferred, the VGS of the N channel MOS transistor M4 becomes zero volt, to which the bias voltage VB is supplied, so that the transistor M4 becomes off state, and the bias circuit 2 becomes a power down state, in which power consumption being reduced.

Figure 4:
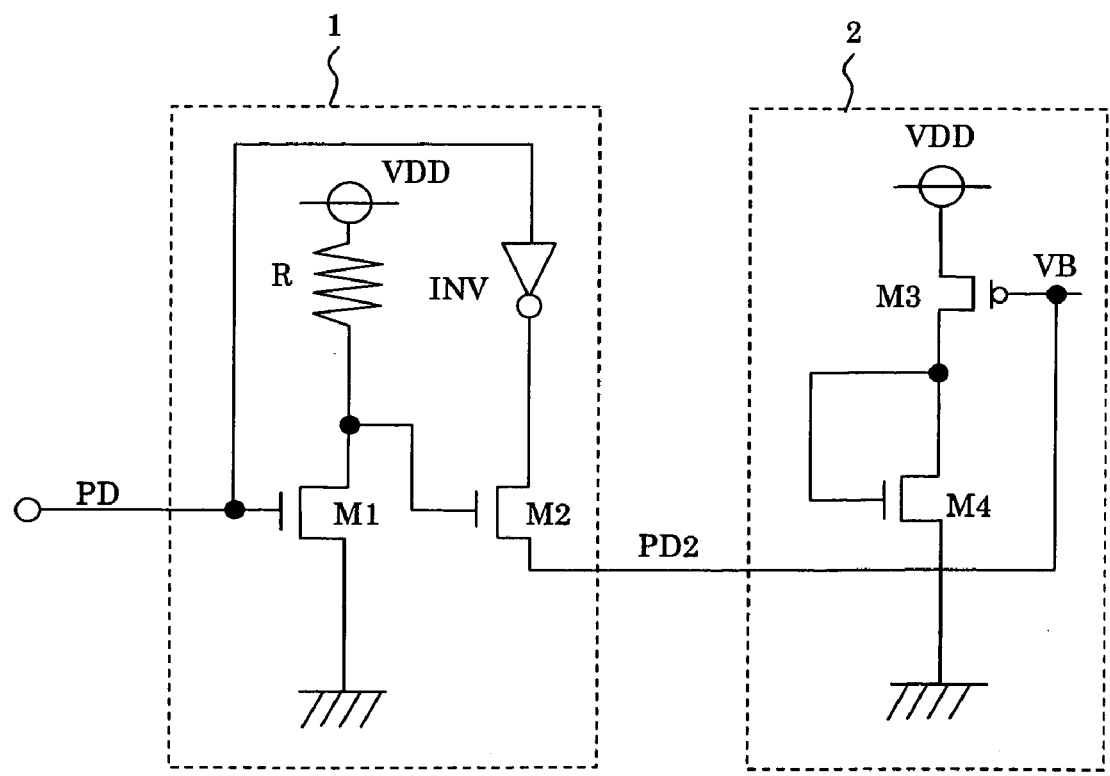
FIG. 4 shows the power down circuit according to the second embodiment of the invention.

Next, a second embodiment of the present invention will be explained referring to the circuit diagram shown in FIG. 4. The differences of the second embodiment from the above-mentioned first embodiment are: the control signal PD is supplied to the second N channel MOS transistor M2 via an inverter INV, the gate of the P channel MOS transistor M3 is connected to the source of the second N channel MOS transistor M2, and the gate of the P channel MOS transistor M3 receive a bias voltage VB. The gate, as well as the drain, of the N channel MOS transistor M4 is connected to the source of the P channel MOS transistor M3. Then, the control signal PD2, which is an inversion of the control signal PD, is supplied to the gate of the P channel MOS transistor M3. The connection relation between the first N channel MOS transistor M1 and the second N channel MOS transistor M2 is the same with the first embodiment.

In the second embodiment, when the control signal PD becomes high-level to cause the first N channel MOS transistor to be ON state and the second N channel MOS transistor M2 to be OFF state. In this case, since the second N channel MOS transistor M2 is OFF state, an inverted low-level signal based on the control signal PD is not supplied to gate of the third P channel MOS transistor M3. Then, the gate voltage of the third P channel MOS transistor M3, to which the bias voltage VB is supplied, is lowered to be the transistor M3 ON state, so that the bias circuit 2 becomes a normal operating state.

On the other hand, when the control signal PD becomes low-level, the first N channel MOS transistor M1 is being OFF state, and the second N channel MOS transistor M2 turns on, since via the second N channel MOS transistor M2, an inverted high-level control signal PD2 is output, the VGS of the third P channel MOS transistor M3, to which the bias voltage VB is supplied, becomes zero volt to cause the same to be OFF state, so that the bias circuit 2 becomes a power down state in which power consumption is reduced.

Thus, according to above-mentioned embodiments, regardless of the power supply voltage VDD fluctuation, when the voltage Vpd of the control signal PD becomes higher than the threshold voltage of the first MOS transistor M1, through that the first MOS transistor M1 is turned on, the second MOS transistor M2 turned off to cause the bias circuit 2 to be operated under a normal operation. It is possible to control the bias current in the later circuit in accordance with the bias voltage VB.

In addition, the present invention is not limited to each of the above-mentioned embodiments, for example, the inverter INV for inverting the control signal PD in the second embodiment can be arranged at the source side of the second N channel MOS transistor M2.

What is claimed is:
1. A power down circuit for controlling a current flow of a subsequent circuit having a N channel MOS transistor and a P channel MOS transistor arranged in series between the power source terminal and a ground terminal, the subsequent circuit also having a control terminal for receiving a bias voltage and an output of the power down circuit, the power down circuit comprising:
  a first N channel MOS transistor having a drain, a source connected to the ground terminal and a gate receiving a power down control signal;
  a load element connected between the power source terminal and the drain of the first N channel MOS transistor; and
  a second N channel MOS transistor having a first terminal for receiving a signal based on the power down control signal, a gate connected to the drain of the first N MOS transistor and a second terminal connected to the control terminal of the subsequent circuit;
  wherein a resistance value of the load element and an operation resistance value of the first N channel MOS transistor are set up so that the second N channel MOS transistor is being OFF state during the first N channel MOS transistor turns on, and the second N channel MOS transistor turns on during the first N channel MOS transistor is being OFF state.

2. A power down circuit according to claim 1, the second terminal of the second N channel MOS transistor is connected to a gate terminal of the N channel MOS transistor of the subsequent circuit.

3. A power down circuit according to claim 1, the first terminal of the second N channel MOS transistor receives an inverted signal of the power down control signal, and the second terminal of the second N channel MOS transistor is connected to a gate terminal of the P channel MOS transistor of the subsequent circuit.

* * * * *